United States Patent
Zhou et al.

(10) Patent No.: US 9,490,832 B1
(45) Date of Patent: Nov. 8, 2016

(54) ANALOG-TO-DIGITAL CONVERTER CIRCUIT AND METHOD OF IMPLEMENTING AN ANALOG-TO-DIGITAL CONVERTER CIRCUIT

(71) Applicant: Xilinx, Inc., San Jose, CA (US)

(72) Inventors: Lei Zhou, San Jose, CA (US); Hiva Hedayati, San Jose, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 14/942,601

(22) Filed: Nov. 16, 2015

(51) Int. Cl.
*H03M 1/06* (2006.01)
*H03M 1/08* (2006.01)
*H03M 1/46* (2006.01)

(52) U.S. Cl.
CPC ........... *H03M 1/0872* (2013.01); *H03M 1/468* (2013.01)

(58) Field of Classification Search
CPC .................................................. H03M 1/0872
USPC .......................... 341/144, 155, 172, 163, 143
See application file for complete search history.

(56) References Cited

U.S. PATENT DOCUMENTS

| | | | |
|---|---|---|---|
| 7,742,553 B1 | 6/2010 | Bataineh et al. | |
| 7,830,986 B1 | 11/2010 | Gaither | |
| 8,548,071 B2 | 10/2013 | Collins | |
| 2006/0132341 A1* | 6/2006 | Koh | H03M 3/47 341/143 |
| 2008/0258959 A1* | 10/2008 | Trifonov | H03M 1/145 341/156 |
| 2011/0169674 A1* | 7/2011 | Kuramochi | H03M 1/0604 341/143 |
| 2013/0135126 A1* | 5/2013 | Cho | H03M 1/462 341/110 |
| 2014/0167995 A1* | 6/2014 | Tiew | H03M 3/30 341/143 |
| 2015/0116140 A1* | 4/2015 | Ide | H03M 1/442 341/122 |

OTHER PUBLICATIONS

Figueiredo Pedro M. et al., Kickback Noise Reduction Techniques for CMOS Latched Comparators, IEEE Transactions on Circuits and Systems-express briefs, vol. 53, No. 7, pp. 541-545, Jul. 2006.

* cited by examiner

*Primary Examiner* — Peguy Jean Pierre
(74) *Attorney, Agent, or Firm* — John J. King; Keith Taboada

(57) ABSTRACT

An analog-to-digital converter circuit is described. The analog-to-digital converter circuit comprises an amplifier circuit configured to receive a differential analog input signal at a first amplifier input associated with a first amplifier current path and a second amplifier input associated with a second amplifier current path, and to generate an amplified differential analog input signal at a first amplifier output associated with the first amplifier current path and a second amplifier output associated with the second amplifier current path; a first capacitor coupled between the first amplifier input and the second amplifier output; a second capacitor coupled between the second amplifier input and the first amplifier output; and a latch circuit having a first latch input coupled to the first amplifier output and a second latch input coupled to the second amplifier output, wherein the latch circuit is configured to generate a differential digital output signal, based upon the amplified differential analog input signal, at a first latch output and a second latch output.

18 Claims, 4 Drawing Sheets

ANALOG-TO-DIGITAL CONVERTER CIRCUIT AND METHOD OF IMPLEMENTING AN ANALOG-TO-DIGITAL CONVERTER CIRCUIT

FIELD OF THE INVENTION

The present invention relates generally to integrated circuit devices, and in particular, to circuits for and methods of implementing an analog-to-digital converter circuit.

BACKGROUND OF THE INVENTION

Comparators are frequently used in analog-to-digital converters (ADCs) to make decisions on input signal voltage or current levels, where the decision is usually made with respect to a reference signal. On a circuit level, the comparator may be implemented using clocked latch circuitry. The clocked latch circuitry causes the output of the comparator to latch on high or low supply levels. When the input signal is very close to the predefined reference threshold, any noise or distortion in the signal path may lead to a wrong decision at the comparator output. Therefore, a pre-amplifier may be introduced before the clocked latch circuitry to amplify the signal to a desirable level.

Signal amplification enhances the overall conversion accuracy of the comparator having a pre-amplifier and a clocked latch. In a typical Successive Approximation Register (SAR) based ADC design, a capacitive digital-to-analog converter (CDAC) holds the input sampled signal at the comparator inputs. In high-speed ADCs, smaller capacitors values of the CDAC are essential to realize high conversion rates. However, a CDAC having smaller capacitors is more susceptible to picking up parasitic noise coupling, which makes kick-back noise an obstacle for ultra-high-speed ADCs. While the pre-amplifier serves as an isolating stage between the clocked latch and the capacitive DAC, it still contributes significant level of transient disturbance.

Therefore, a circuit for implementing an analog-to-digital converter that reduces the kick-back noise would be beneficial.

SUMMARY OF THE INVENTION

An analog-to-digital converter circuit is described. The analog-to-digital converter circuit comprises an amplifier circuit configured to receive a differential analog input signal at a first amplifier input associated with a first amplifier current path and a second amplifier input associated with a second amplifier current path, and to generate an amplified differential analog input signal at a first amplifier output associated with the first amplifier current path and a second amplifier output associated with the second amplifier current path; a first capacitor coupled between the first amplifier input and the second amplifier output; a second capacitor coupled between the second amplifier input and the first amplifier output; and a latch circuit having a first latch input coupled to the first amplifier output and a second latch input coupled to the second amplifier output, wherein the latch circuit is configured to generate a differential digital output signal, based upon the amplified differential analog input signal, at a first latch output and a second latch output.

A method of implementing an analog-to-digital converter circuit is also described. The method comprises receiving a differential analog input signal at a first amplifier input of a first amplifier path of an amplifier circuit and a second amplifier input of a second amplifier path of the amplifier circuit, reducing noise at the first amplifier input and the second amplifier input by coupling a first capacitor between the first amplifier input and a second amplifier output and coupling a second capacitor between the second amplifier input and a first amplifier output; generating an amplified differential analog input signal at the first amplifier output and the second amplifier output; latching data at a first latch input that is coupled to the first amplifier output and at a second latch input that is coupled to the second amplifier output; and generating a differential digital output signal, based upon the amplified differential analog input signal, at a first latch output and a second latch output.

Other features will be recognized from consideration of the Detailed Description and the Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods relate to Analog-to-Digital Converter (ADC) designs, and particularly Successive Approximation Register (SAR) based ADCs that are capable of receiving high-speed data. The circuits and methods enhance the conversion accuracy of a comparator of the ADC by reducing the kick-back noise from the comparator. A neutralization technique for pre-amplifier circuitry effectively reduces the kick back noise, enabling the use of a smaller net capacitance in a CDAC. The smaller net capacitance enables a higher signaling bandwidth that is essential in utilizing the ADCs for high-speed wireline and wireless applications.

According to one implementation, an analog-to-digital converter circuit comprises a first capacitor coupled between a first amplifier input and a second amplifier output of an amplifier circuit, and a second capacitor coupled between a second amplifier input and a first amplifier output the amplifier circuit. The first and second capacitors reduce the kickback noise, and make it possible to use smaller capacitors in the CDAC circuit.

Figure 1:
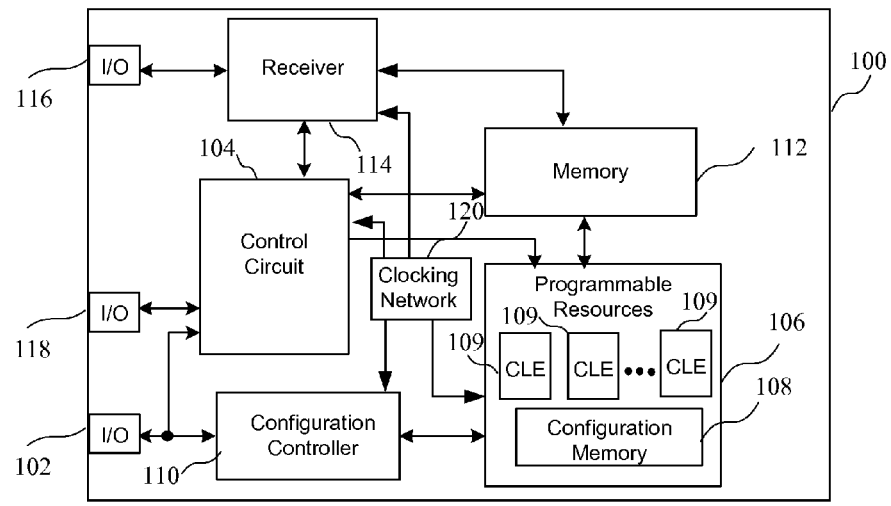
FIG. 1 is a block diagram of an integrated circuit including a receiver having an analog-to-digital converter circuit.

Turning first to FIG. 1, a block diagram of an integrated circuit including a receiver having an analog-to-digital converter circuit is shown. In particular, an input/output port 102 is coupled to a control circuit 104 that controls programmable resources 106 having configuration memory 108. Configuration data may be provided to the configuration memory 108 by a configuration controller 110. The configuration data enables the operation of configurable logic elements 109. While CLEs are shown by way of example as one type of programmable resource, it should be understood that other programmable resources could be implemented. A memory 112 may be coupled to the control circuit 104 and the programmable resources 106. A receiver circuit 114 may be coupled to the control circuit 104, programmable resources 106 and the memory 112, and may receive signals external to the integrated circuit device by way of I/O port 116. Other I/O ports may be coupled to circuits of the integrated circuit device, such as I/O port 118 that is coupled to the control circuit 104 as shown. A clocking network 120 is coupled to various elements of the circuit of FIG. 1. The circuits and methods of receiving data described in more detail below may be implemented by various elements of the circuit of FIG. 1, and particularly the receiver circuit 114 to receive a differential analog input signal as described below.

Figure 2:
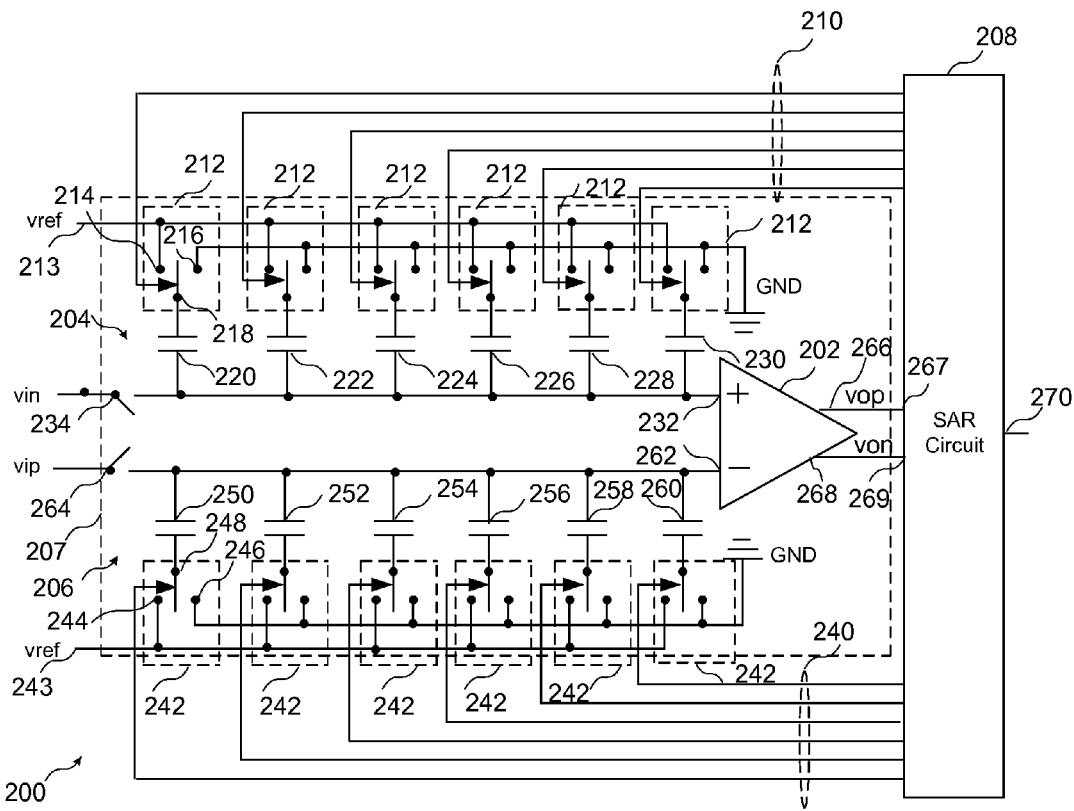
FIG. 2 is a block diagram of an SAR-based analog-to-digital converter circuit implemented in the receiver of FIG. 1.

Turning now to FIG. 2, a block diagram of an SAR-based analog-to-digital converter circuit 200 that may be implemented in the receiver of FIG. 1 is shown. The SAR-based analog-to-digital converter circuit 200 comprises a comparator circuit 202, operating as an analog-to-digital converter, coupled to a first capacitive network 204 and a second capacitive network 206 that forms a CDAC circuit 207. A Successive Approximation Register (SAR) circuit 208 is coupled to an output of the comparator circuit 202, and controls the operation of the first capacitive network 204 and the second capacitive network 206 to determine a value of an input signal. More particularly, first control lines 210 comprises a plurality of control lines having a control line for each of a plurality of switches 212 controlling a corresponding capacitor. The switch 212 comprises a first terminal 214 coupled to a reference voltage (vref) at a reference voltage node 213 and a second terminal 216 coupled to a ground voltage (GND). The switch 212 enables the routing of either the reference voltage or the ground voltage to a node 218 of the switch that is coupled to a first terminal of a corresponding capacitor. Six capacitors 220-230 are shown, where a corresponding switch 212 controls the application of either the reference voltage or ground voltage to the first terminal of the capacitor. A second terminal of the each of the capacitors 220-230 is coupled to a first input 232 of the comparator circuit 202. A first input voltage (yin) of a differential pair of analog input voltages is also coupled to the input 232 by way of a switch 234.

Second control lines 240 comprises a plurality of control lines having a control line for each of a plurality of switches 242 controlling a corresponding capacitor. Each switch 242 comprises a first terminal 244 coupled to the reference voltage and a second terminal 246 coupled to the ground voltage. The switch 242 enables the routing of either the reference voltage or the ground voltage to a node 248 of the switch that is coupled to a first terminal of a corresponding capacitor. Six capacitors 250-260 are shown, where a corresponding switch 242 controls the application of either the reference voltage (at the reference voltage node 243) or ground voltage to the first terminal of the capacitor. A second terminal of the each of the capacitors 250-260 is coupled to a second terminal 262 of the comparator circuit 202. A second input voltage (vip) of a differential pair of analog input voltages is also coupled to the input terminal 262 by way of a switch 264. Differential digital outputs von and vop are coupled to corresponding inputs of the SAR circuit 208. In particular, an output 266 of the comparator circuit 202 is coupled to a corresponding input 267 of the SAR circuit 208, and an output 268 is coupled to a corresponding input 269 of the SAR circuit 208. A determination of the input voltages yin and vip are generated at an output 270 of the SAR circuit. It should be noted that while the pre-amplifier is shown implemented with NMOS transistors, the transistors of FIG. 3 could be implemented as PMOS transistors, depending upon the voltage level at the input of the pre-amplifier.

In operation, the switches 234 and 264 are closed, allowing the yin signal to charge the capacitors 220-230 and the vip signal to charge to capacitors 250-260 in a first stage, where the switches 212 are set so that the node 218 is coupled to the second reference terminal 216 and the switches 242 are set so that the nodes 248 are coupled to the second terminal 246 to enable the capacitors to charge. The values at the inputs 232 and 262 represent captured differential analog input signals associated with the differential analog input signals yin and vip. The switches 212 and 242 are then sequentially decoupled, where a comparison is made to determine the value of the input signal.

In order to meet the bandwidth requirement, a front-end switch and buffer cannot drive a large CDAC, and the size of capacitors of the CDAC array have to be minimized for speed. As will be described in more detail in reference to FIG. 5, the capacitators, which extend from a large capacitance value of capacitators 220 and 250 to smaller capacitance values 230 and 260, respectively, are sequentially enabled or disabled until there is no difference between the inputs of the comparators. During a discharge mode, the switches 234 and 264 are opened, and the switches 212 and 242 are set to enable discharging of the capacitor.

Figure 3:
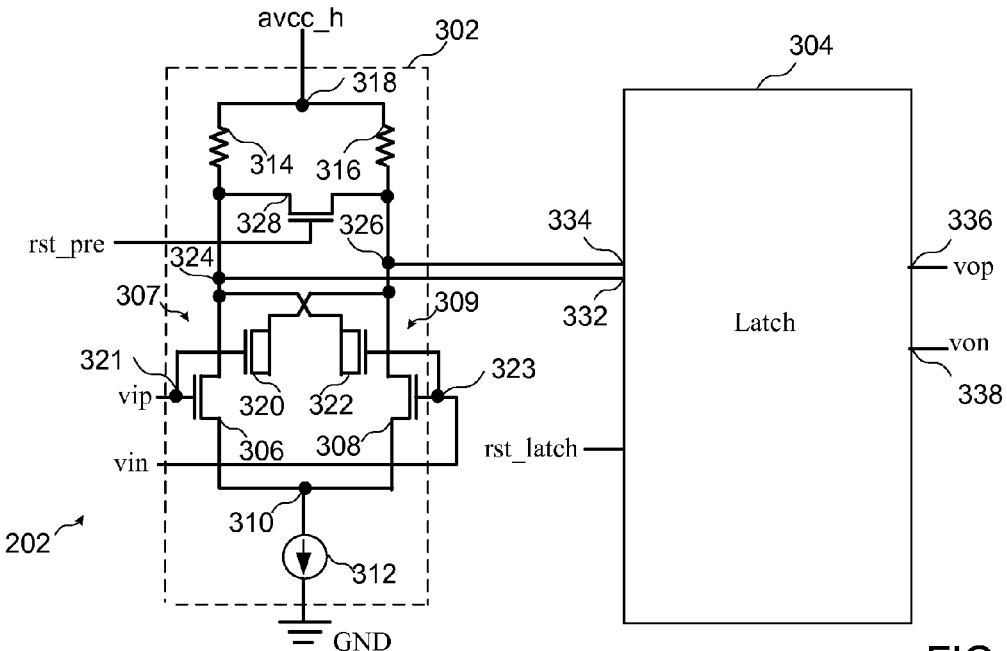
FIG. 3 is a block diagram of an amplifier circuit and a latch circuit of a comparator circuit of FIG. 2.

Turning now to FIG. 3, a block diagram of an amplifier circuit and a latch circuit of the comparator circuit 202 of FIG. 2 is shown. The comparator circuit 202 comprises a pre-amplifier 302 coupled to a latch circuit 304. The pre-amplifier is made of a NMOS differential pair with resistor load, and comprises a PMOS reset switch to reset the preamp output for overdrive recovery. More particularly, the pre-amplifier 302 comprises a first transistor 306 associated with a first amplifier current path 307 and a second transistor 308 associated with a second amplifier current path 309 coupled in parallel between a high power reference voltage (avcc_h) and a node 310 coupled to the ground voltage (GND) by way of a current source 312. Each of the transistors 306 and 308 comprises a source coupled to the node 310, and a drain coupled to a corresponding resistor 314 and 316. That is, a drain of the transistor 306 is coupled to a first terminal of the resistor 314, which has a second terminal coupled to a node 318 receiving the high power reference voltage. A drain of the transistor 308 is coupled to a first terminal of the resistor 316, which has a second terminal coupled to the node 318.

Kickback noise is a result of finite isolation between input and output of an analog-to-digital converter, especially for the comparator 202 because input can be much smaller (e.g.

in the millivolt (mV) range) than the output, which can be as high as the reference voltage avcc_I (i.e. approximately 0.9V). Since the comparator is running sequentially in the SAR ADC, any disturbance on the comparator input will slow down ADC conversion speed, as the comparator has to wait for the input to be stable before making a correct decision in next cycle. For example, if the output is 900 mV and kick back noise of 1 mV requires isolation of approximately 60 dB, an input to the comparator of less than 1 mV will become negative voltage if noise at the inputs of the comparator is out of phase with input signal. Therefore, an output of the comparator that should be positive would be mistakenly determined to be negative due to kickback noise. In addition, the kickback noise is even worse if input impedance is high, as the noise coupled to input of the comparator is proportional to source impedance. Because the input impedance is chosen to be high to achieve a high speed in an SAR DAC, the implementation of the capacitors 320 and 322 in the comparator 202 provides a significant benefit in an SAR DAC.

In order to account for kickback noise produced by the pre-amplifier, a capacitor, for each of the input terminals of the pre-amplifier 302, is coupled between an input terminal associated with one amplifier current path and the output terminal associated with the other amplifier current path. More particularly, a first capacitor 320 is coupled between a first input terminal 321 (coupled to receive the vip input signal), such as at the gate of the transistor 306, and a second output terminal 326. A second capacitor 322 is coupled between a second input terminal 323 (coupled to receive the yin input signal), such as at the gate of the transistor 308, and a first output terminal 324. That is, the source and drains of each of the transistors implemented as capacitors 320 and 322 are coupled together to form source/drain nodes. One of the source/drain node or the gate of the transistor implemented as a capacitor 320 is coupled to the gate of the transistor 306, and the other of the source/drain node or the gate of the transistor implemented as a capacitor 320 is coupled to the second output terminal 326. Similarly, one of the source/drain node or gate of the transistor implemented as the capacitor 322 is coupled to a gate of the transistor 308, and the other source/drain node and the gate is coupled to the first output terminal 324. The transistors implementing the capacitors 320 and 322 may be implemented as a transistor with half the size of the input transistors 306 and 308. For example, transistors 306 and 308 may have a gate width of approximately 3 micrometers (μm) and a gate length of approximately 16 nanometers (nm), while the transistors implemented as capacitors 320 and 322 may have a gate width of approximately 1.5 μm and a gate length of approximately 16 nm. The capacitors in each path effectively add capacitance to the other path to create an equal capacitance to cancel out the kickback current due to drain variation. The capacitors 320 and 322 may be approximately 2 femtofarads (fF).

A reset switch 328, shown here as a transistor having a gate coupled to receive a reset signal (rst_pre), is implemented for the pre-amplifier 302 to reset the output nodes of the pre-amplifier. The reset signal may be a low speed clock signal that also controls the switches 234 and 264. The first output terminal 324 is coupled to a first input 332 of the latch circuit 304, and the second output terminal 326 is coupled to a second input 334 of the latch circuit 304. Differential digital output signals vop and von are generated at differential output terminals 336 and 338, which are outputs of the comparator circuit 202 coupled to the SAR circuit 208.

Accordingly, the implementation of the capacitors 320 and 322 are cross-coupled between the inputs and outputs of the pre-amplifier and function as blocking capacitors to reduce the DC offset, reduce noise on the inputs of the comparator, and reduce kick-back from clocked latch. It should be noted that the neutralization technique is more effective in the pre-amplifier than in the latched comparator because of the small signal nature of the input to the comparator. That is, the cross-coupled capacitators 320 and 322 reduce kickback noise as a result of current from the output nodes to the drains of the transistors 306 and 308 that may be relatively large compared to the input signal to the pre-amplifier.

Figure 4:
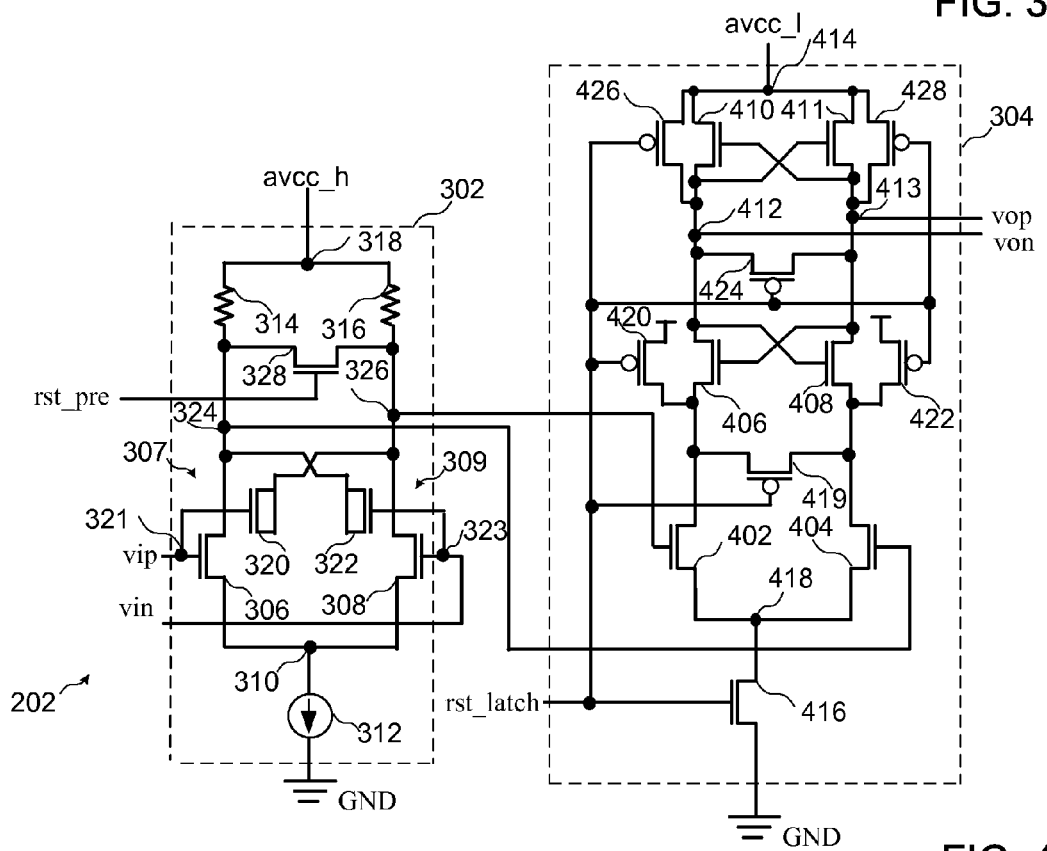
FIG. 4 is a more detailed block diagram of the amplifier circuit and a latch circuit of a comparator circuit of FIG. 2.

Turning now to FIG. 4, is a more detailed block diagram of the amplifier circuit and a latch circuit of a comparator of FIG. 2 is shown. As shown in the implementation of FIG. 4, the latch circuit 304 comprises a clock latch having a first transistor 402 coupled in parallel with a second transistor 404. A gate of the first transistor 402 is coupled to the output terminal 326 and a gate of the second transistor 404 is coupled to the output terminal 324. Cross-coupled transistors 406 and 408 are also coupled between the drains of the transistors 402 and 404 and a second pair of cross-coupled transistors 410 and 411 at output nodes 412 and 413, which correspond to the output terminals 338 and 336 of the latch circuit 304. Drains of the transistors 410 and 411 are coupled to a low power reference voltage (avcc_I) at a node 414. The high power reference avcc_h is provided to the pre-amplifier 302 to ensure that the signal provided to the inputs of the latch circuit 304 is large enough to ensure accurate outputs of the latch. Sources of the transistors 402 and 404 are coupled to a transistor 416 at a node 418, where the transistor 416 controls a current path to ground.

The circuit of FIG. 4 further comprises transistors for resetting nodes of the clocked latch using a reset latch (rst_latch) signal. The reset latch signal is coupled to a gate of N-channel transistor 416, and turns on the transistor 416 to enable the latching of data on the output terminals 324 and 326 to the output nodes 413 and 412 when the reset latch signal is high. A plurality of PMOS transistors are also provided reset nodes of the latch. In particular, a first PMOS transistor 419 is coupled between the drains of transistors 402 and 404, and the sources of transistors 406 and 408 are coupled to the drains of transistors 420 and 422 respectively. A transistor 424 is also coupled across the drains of transistors 406 and 408. Transistors 426 and 428 are also coupled in parallel with transistors 410 and 411, respectively. The PMOS transistors are provided to ensure that the nodes of the latch are quickly returned to desired voltages.

Figure 5:
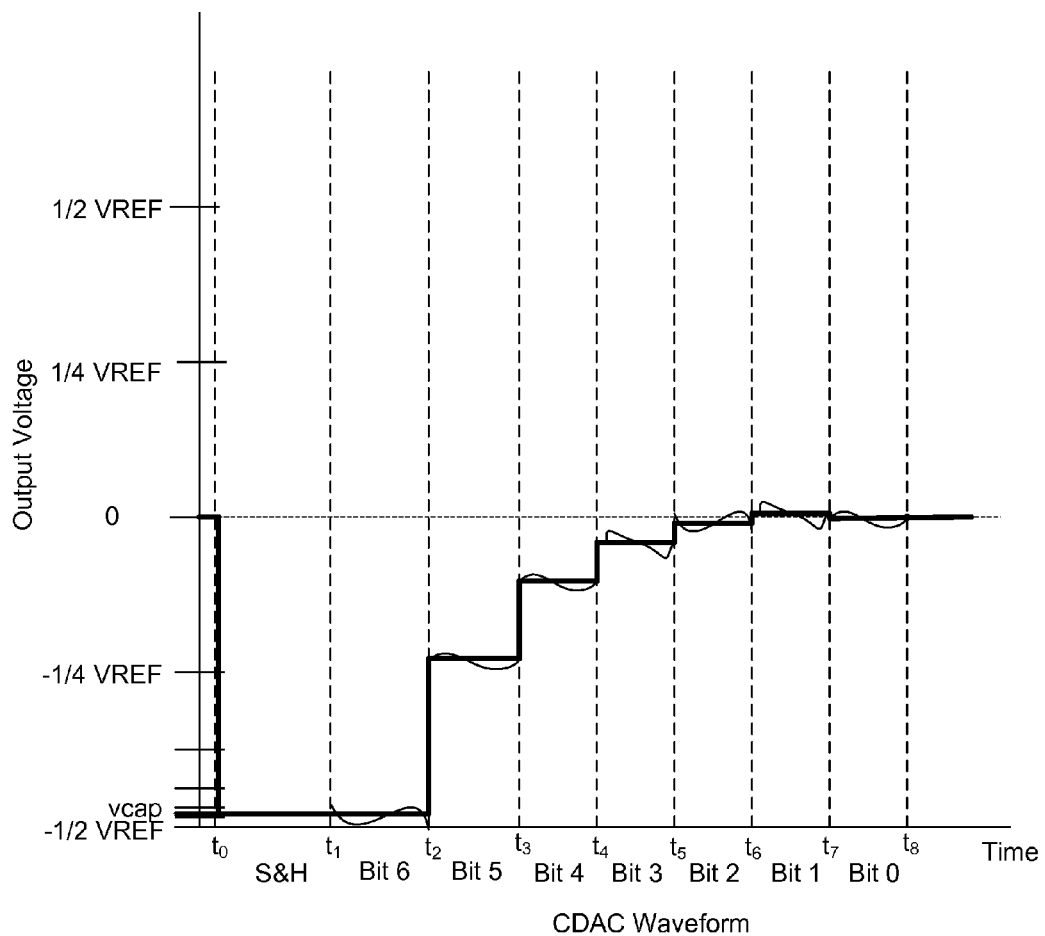
FIG. 5 is a timing diagram showing the waveform of the signal at the inputs to the comparator circuit of FIG. 2.

Turning now to FIG. 5, a timing diagram shows the waveform of the signal at the inputs to the comparator circuit of FIG. 2. In operation, the capacitors of the circuit of FIG. 2 are selectively switched in or out, from the higher capacitor values to the lower capacitor values, to determine a value of the yin and vip signals. The capacitors preferably decrease in size by a factor of 2 (from the first capacitor 220 to the last capacitor 230 and from the first capacitor 250 to the last capacitor 260) so that the voltages applied to the inputs of the comparator will enable the comparator to determine when the difference between the yin and vip values is equal to zero. That is, by the capacitors are selectively applied to the input nodes until the correct combination of capacitors enables convergence to the voltage value that results in a zero difference between the yin and vip values. In particular, during a sample and hold (S&H) period between times $t_0$ and $t1$, the switches 234 and 264 are closed, enabling the capacitors to charge. After the switches 234 and 264 are opened at time $t_1$, bits generated on control lines 210 and 240 controlling a corresponding capacitor are then selectively switched, from the most significant bit, bit 6, to the least significant bit, bit 0, to determine the voltage associated with the capacitors that lead to a zero differential between the input signal, and therefore to determine the magnitude of the analog inputs signals yin and vip. An example of the switching of capacitors to enable a convergence to a zero differential at the inputs of the comparator is shown in FIG. 5, where 6 capacitors enable a seven bit output (enabling the detection of one of 128 bit voltage levels).

Because the minimized capacitance at the pre-amplifier input leads to increased input impedance, CDAC is susceptible to kick back noise from latch, even with pre-amplifier, as illustrated with the noise signals shown in FIG. 5. The kick back noise during the conversion period appears as dynamic error, and therefore degrades the ADC's overall accuracy. The waveform shown by the lighter lines indicates the noise on the output signal of the comparator that would be present in a conventional circuit. In order to minimize the error, the neutralization technique of implementing capacitors 320 and 322 reduces noise on the output signal. As shown by the solid waveforms in FIG. 5, the kickback cancellation technique effectively reduces the conversion error, which significantly improves the overall ADC performance. This technique enables much smaller CDAC design without sacrificing accuracy, which enables high speed, highly accurate, low power ADC design.

Figure 6:
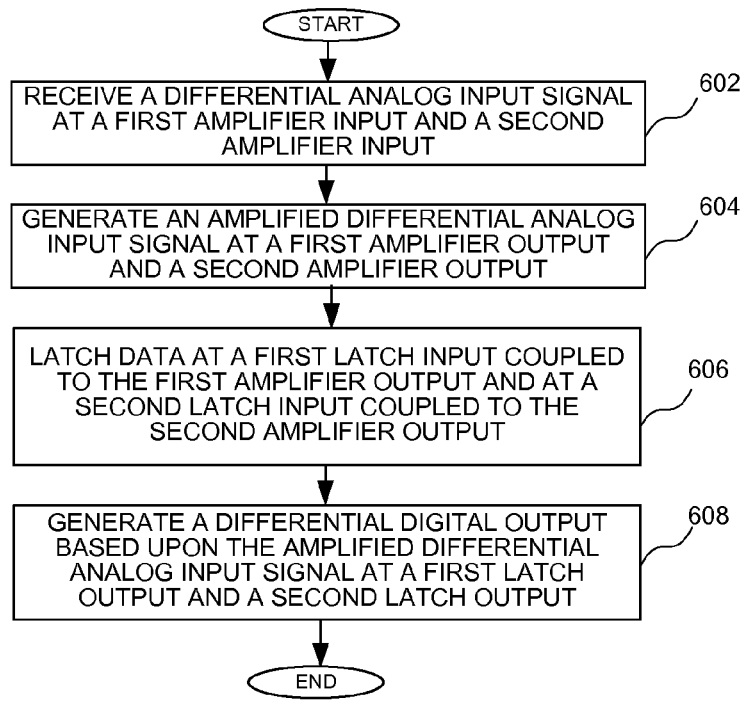
FIG. 6 is a flow chart showing a method of implementing an analog-to-digital converter circuit.

Turning now to FIG. 6, a flow chart shows a method of implementing an analog-to-digital circuit. The method of FIG. 6 may be implemented using an amplifier circuit having first and second amplifier inputs and first and second amplifier outputs, such as amplifier circuit 302 comprising a pre-amplifier, where an amplified differential analog input signal is generated at the first amplifier output and the second amplifier output. The amplifier circuit may comprise capacitors that are coupled between inputs and outputs, as described above reference to FIG. 3.

In particular first capacitor, such as capacitor 320, may be coupled between the first amplifier input associated with a first amplifier current path and the second amplifier output associated with a second amplifier current path. The first capacitor may comprise a third transistor having a source connected to a drain to form a source/drain node of the third transistor, where one of a gate and the source/drain node of the third transistor is coupled to the gate of a first transistor and the other of the gate and the source/drain node of the third transistor is coupled to a drain of a second transistor.

A second capacitor such as capacitor 322 may be coupled between the second amplifier input associated with the second current path and the first amplifier output associated with the first current path. The second capacitor may comprise a fourth transistor having a source connected to a drain to form a source/drain node of the fourth transistor, where one of a gate and the source/drain node of the fourth transistor is coupled to the gate of the second transistor and the other of the gate and the source/drain node of the fourth transistor is coupled to a drain of the first transistor. A first resistive load may be coupled between a reference voltage and the first transistor of the first amplifier current path, wherein a first input signal of the differential analog input signal is coupled to a gate of the first transistor. Similarly, a second resistive load may be coupled between the reference voltage and the second transistor of the second amplifier current path, wherein a second input signal of the differential analog input signal is coupled to a gate of the second transistor.

According to the method of FIG. 6, a differential analog input signal is received at the first amplifier input and the second amplifier input at a block 602. An amplified differential analog input signal is generated at a first amplifier output and a second amplifier output at a block 604. Data is latched at a first latch input coupled to the first amplifier output and at a second latch input coupled to the second amplifier output at a block 606. A differential digital output signal based upon the amplified differential analog input signal is generated at a first latch output and a second latch output at a block 608.

During operation, a current source is coupled from a source of the first transistor and a source of the second transistor to a ground node, such as by a current source 312 shown in FIG. 3. A clock signal is coupled to a clock input of the clocked latch, such as shown in FIG. 4, to enable the resetting the latch. The latch may be reset after the capacitors 220-230 and 250-260 are charged and the switches 234 and 264 are then opened.

Figure 7:
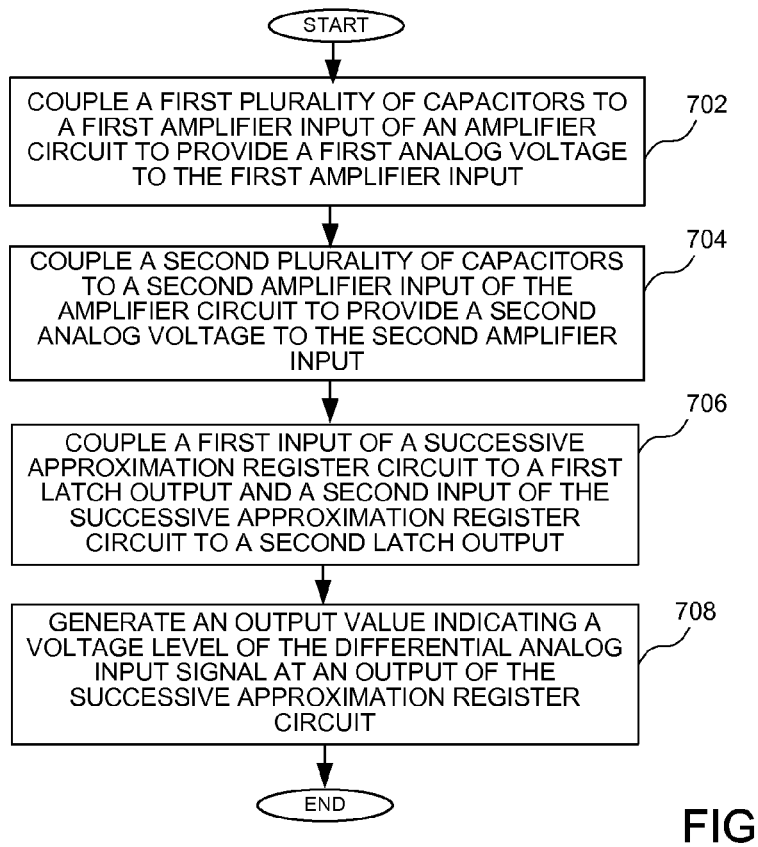
FIG. 7 is a flow chart showing a method of implementing an analog-to-digital converter circuit in a capacitive DAC.

Turning now to FIG. 7, a method of implementing an analog-to-digital converter circuit in a capacitive DAC is shown. That is, the amplifier circuit may be implemented as part of a comparator used in a capacitive DAC, as described above. More particularly, a first plurality of capacitors may be selectively coupled to the first amplifier input of the amplifier circuit to provide an analog voltage to the first amplifier input at block 702. A second plurality of capacitors may be selectively coupled to the second amplifier input of the amplifier circuit to provide an analog voltage to the second amplifier input at a block 704. After the capacitators are charged during a sample and hold period, the capacitor are selectively toggled by a higher speed clock than the clock controlling the switches 234 and 264 and the reset signal to enable convergence to a zero differential value between inputs of the comparator, as set forth above. A first input of a successive approximation register circuit may be coupled to the first latch output and a second input of the successive approximation register may be coupled to the second latch output at a block 706, where an output value indicating a voltage level of the input signal is generated at an output of the successive approximation register circuit at a block 708. While the method of FIGS. 6 and 7 may be implemented using the circuits as described above in reference to FIGS. 1-4, other suitable circuits could be implemented.

It can therefore be appreciated that new circuits and methods of implementing an analog-to-digital converter circuit have been described. It will be appreciated by those skilled in the art that numerous alternatives and equivalents will be seen to exist that incorporate the disclosed invention. As a result, the invention is not to be limited by the foregoing embodiments, but only by the following claims.

We claim:
1. An analog-to-digital converter circuit comprising:
an amplifier circuit configured to receive a differential analog input signal at a first amplifier input associated with a first amplifier current path and a second amplifier input associated with a second amplifier current path, and to amplify the differential analog input signal to generate a differential analog output signal at a first amplifier output associated with the first amplifier current path and at a second amplifier output associated with the second amplifier current path, wherein:

the amplifier circuit comprises a first resistive load coupled between a reference voltage and a first transistor of the first amplifier current path;

a first input signal of the differential analog input signal is coupled to a gate of the first transistor;

the amplifier circuit further comprises a second resistive load coupled between the reference voltage and a second transistor of the second amplifier current path; and a second input signal of the differential analog input signal is coupled to a gate of the second transistor;

a first capacitor coupled between the first amplifier input and the second amplifier output;

a second capacitor coupled between the second amplifier input and the first amplifier output; and a latch circuit having a first latch input coupled to the first amplifier output and a second latch input coupled to the second amplifier output, wherein the latch circuit is configured to generate a differential digital output signal, based upon the differential analog output signal, at a first latch output and a second latch output.

2. The analog-to-digital converter circuit of claim 1 wherein the first capacitor and the second capacitor are approximately 2 femtofarads.

3. The analog-to-digital converter circuit of claim 1 wherein:

the first capacitor comprises a third transistor having a source connected to a drain to form a source/drain node of the third transistor;

one of a gate and the source/drain node of the third transistor is coupled to a gate of the first transistor; and the other of the gate and the source/drain node of the third transistor is coupled to a drain of the second transistor.

4. The analog-to-digital converter circuit of claim 3 wherein:

the second capacitor comprises a fourth transistor having a source connected to a drain to form a source/drain node of the fourth transistor;

one of a gate and the source/drain node of the fourth transistor is coupled to a gate of the second transistor; and the other of the gate and the source/drain node of the fourth transistor is coupled to a drain of the first transistor.

5. The analog-to-digital converter circuit of claim 4 wherein the third transistor and the fourth transistor have gate widths that are approximately one half the gate widths of the first transistor and the second transistor.

6. The analog-to-digital converter circuit of claim 1 further comprising a capacitive digital-to-analog converter circuit having a first plurality of capacitors that are coupled to the first amplifier input of the amplifier circuit to provide a first analog voltage to the first amplifier input.

7. The analog-to-digital converter circuit of claim 6 wherein the capacitive digital-to-analog converter circuit further comprises a second plurality of capacitors that are coupled to the second amplifier input of the amplifier circuit to provide a second analog voltage to the second amplifier input.

8. The analog-to-digital converter circuit of claim 1 further comprising a successive approximation register circuit having a first input coupled to the first latch output and a second input coupled to the second latch output.

9. The analog-to-digital converter circuit of claim 8 wherein the successive approximation register circuit generates an output value indicating a voltage level of the differential input signal.

10. A method of implementing an analog-to-digital converter circuit comprising:

receiving a differential analog input signal at a first amplifier input of a first amplifier path of an amplifier circuit and a second amplifier input of a second amplifier path of the amplifier circuit;

reducing noise at the first amplifier input and the second amplifier input via a first capacitor coupled between the first amplifier input and a second amplifier output associated with the second amplifier path and via a second capacitor coupled between the second amplifier input and a first amplifier output associated with a first amplifier path;

amplifying the differential analog input signal to generate a differential analog output signal at the first amplifier output and the second amplifier output;

latching data at a first latch input that is coupled to the first amplifier output and at a second latch input that is coupled to the second amplifier output; and generating a differential digital output signal, based upon the differential analog output signal, at a first latch output and a second latch output; wherein:

a first resistive load is coupled between a reference voltage and a first transistor of the first amplifier current path;

a first input signal of the differential analog input signal is coupled to a gate of the first transistor;

a second resistive load is coupled between the reference voltage and a second transistor of the second amplifier current path; and a second input signal of the differential analog input signal is coupled to a gate of the second transistor.

11. The method of claim 10 wherein the first capacitor and the second capacitor are approximately 2 femtofarads.

12. The method of claim 10 wherein:

the first capacitor comprises a third transistor having a source connected to a drain to form a source/drain node of the third transistor;

one of a gate and the source/drain node of the third transistor is coupled to the gate of the first transistor; and the other of the gate and the source/drain node of the third transistor is coupled to a drain of the second transistor.

13. The method of claim 12 wherein:

the second capacitor comprises a fourth transistor having a source connected to a drain to form a source/drain node of the fourth transistor;

one of a gate and the source/drain node of the fourth transistor is coupled to the gate of the second transistors; and the other of the gate and the source/drain node of the fourth transistor is coupled to a drain of the first transistor.

14. The method of claim 13 wherein the third transistor and the fourth transistor have gate widths that are approximately one half the gate widths of the first and second transistors.

15. The method of claim 10 further comprising coupling a first plurality of capacitors to the first amplifier input of the amplifier circuit to provide a first analog voltage to the first amplifier input.

16. The method of claim 15 further comprising coupling a second plurality of capacitors to the second amplifier input of the amplifier circuit to provide a second analog voltage to the second amplifier input.

17. The method of claim 10 further comprising coupling a first input of a successive approximation register circuit to the first latch output and a second input of the successive approximation register to the second latch output.

18. The method of claim 17 further comprising generating an output value indicating a voltage level of the differential analog input signal at an output of the successive approximation register circuit.

* * * * *